US010593876B2

(12) United States Patent
Howard et al.

(10) Patent No.: US 10,593,876 B2
(45) Date of Patent: Mar. 17, 2020

(54) INTEGRATED SEMICONDUCTOR DEVICE INCLUDING AN ELECTRICALLY INSULATIVE SUBSTRATE UNDER AN ELECTRICALLY CONDUCTIVE OR SEMICONDUCTIVE HEAT SPREADER AND PHASE-CHANGE MATERIAL (PCM) RADIO FREQUENCY (RF) SWITCHES

(71) Applicant: Newport Fab, LLC, Newport Beach, CA (US)

(72) Inventors: David J. Howard, Irvine, CA (US); Nabil El-Hinnawy, Irvine, CA (US); Gregory P. Slovin, Irvine, CA (US); Jefferson E. Rose, Hawthorne, CA (US)

(73) Assignee: Newport Fab, LLC, Newport Beach, CA (US)

(*) Notice: Subject to any disclaimer, the term of this patent is extended or adjusted under 35 U.S.C. 154(b) by 0 days.

(21) Appl. No.: 16/534,328

(22) Filed: Aug. 7, 2019

(65) Prior Publication Data
US 2020/0058866 A1 Feb. 20, 2020

Related U.S. Application Data

(60) Division of application No. 16/274,021, filed on Feb. 12, 2019, which is a continuation-in-part of (Continued)

(51) Int. Cl.
*H01L 45/00* (2006.01)
(52) U.S. Cl.
CPC .......... *H01L 45/1286* (2013.01); *H01L 45/06* (2013.01); *H01L 45/1226* (2013.01); *H01L 45/1293* (2013.01)

(58) Field of Classification Search
CPC .. H01L 45/06; H01L 45/1226; H01L 45/1286
See application file for complete search history.

(56) References Cited

U.S. PATENT DOCUMENTS 9,257,647 B2* 2/2016 Borodulin ............. H01L 45/126
9,362,492 B2* 6/2016 Goktepeli ........... H01L 45/1608
(Continued)

FOREIGN PATENT DOCUMENTS

WO WO 2016/028362 2/2016

OTHER PUBLICATIONS

G. Slovin, et al., "Design Criteria in Sizing Phase-Change RF Switches," in *IEEE Transactions on Microwave Theory and Techniques*, vol. 65, No. 11, pp. 4531-4540, Nov. 2017.
(Continued)

*Primary Examiner* — Allison Bernstein
(74) *Attorney, Agent, or Firm* — Farjami & Farjami LLP

(57) ABSTRACT

A semiconductor device includes a substrate, an integrated passive device (IPD), and a phase-change material (PCM) radio frequency (RF) switch. The PCM RF switch includes a heating element, a PCM situated over the heating element, and PCM contacts situated over passive segments of the PCM. The heating element extends transverse to the PCM, with a heater line underlying an active segment of the PCM. The PCM RF switch is situated over a heat spreader that is situated over the substrate. The heat spreader and/or the substrate dissipate heat generated by the heating element and reduce RF noise coupling between the PCM RF switch and the IPD. An electrically insulating layer can be situated between the heat spreader and the substrate. In another approach, the PCM RF switch is situated over an RF isolation region that allows the substrate to dissipate heat and that reduces RF noise coupling.

18 Claims, 13 Drawing Sheets

Related U.S. Application Data application No. 16/103,490, filed on Aug. 14, 2018, now Pat. No. 10,476,001, and a continuation-in-part of application No. 16/103,587, filed on Aug. 14, 2018, now Pat. No. 10,461,253, and a continuation-in-part of application No. 16/103,646, filed on Aug. 14, 2018, now Pat. No. 10,475,993, and a continuation-in-part of application No. 16/114,106, filed on Aug. 27, 2018.

(56) References Cited

U.S. PATENT DOCUMENTS 9,368,720 B1   6/2016   Moon
9,917,104 B1   3/2018   Roizin

OTHER PUBLICATIONS

N. El-Hinnawy et al., "A 7.3 THz Cut-Off Frequency, Inline, Chalcogenide Phase-Change RF Switch Using an Independent Resistive Heater for Thermal Actuation," *2013 IEEE Compound Semiconductor Integrated Circuit Symposium (CSICS)*, Monterey, CA, 2013, pp. 1-4.

G. Slovin, et al. "AlN Barriers for Capacitance Reduction in Phase-Change RF Switches," in *IEEE Electron Device Letters*, vol. 37, No. 5, pp. 568-571, May 2016.

* cited by examiner

INTEGRATED SEMICONDUCTOR DEVICE INCLUDING AN ELECTRICALLY INSULATIVE SUBSTRATE UNDER AN ELECTRICALLY CONDUCTIVE OR SEMICONDUCTIVE HEAT SPREADER AND PHASE-CHANGE MATERIAL (PCM) RADIO FREQUENCY (RF) SWITCHES

CLAIMS OF PRIORITY

This is a divisional of application Ser. No. 16/274,021 filed on Feb. 12, 2019. Application Ser. No. 16/274,021 filed on Feb. 12, 2019 ("the parent application") is a continuation-in-part of and claims the benefit of and priority to application Ser. No. 16/103,490 filed on Aug. 14, 2018, titled "Manufacturing RF Switch Based on Phase-Change Material,". The parent application is also a continuation-in-part of and claims the benefit of and priority to application Ser. No. 16/103,587 filed on Aug. 14, 2018, titled "Design for High Reliability RF Switch Based on Phase-Change Material,". The parent application is also a continuation-in-part of and claims the benefit of and priority to application Ser. No. 16/103,646 filed on Aug. 14, 2018, titled "PCM RF Switch Fabrication with Subtractively Formed Heater,". The parent application is further a continuation-in-part of and claims the benefit of and priority to application Ser. No. 16/114,106 filed on Aug. 27, 2018, titled "Fabrication of Contacts in an RF Switch Having a Phase-Change Material (PCM) and a Heating Element,". The disclosures and contents of all of the above-identified applications are hereby incorporated fully by reference into the parent application and the present divisional application.

BACKGROUND

Phase-change materials (PCM) are capable of transforming from a crystalline phase to an amorphous phase. These two solid phases exhibit differences in electrical properties, and semiconductor devices can advantageously exploit these differences. Given the ever-increasing reliance on radio frequency (RF) communication, there is particular need for RF switching devices to exploit phase-change materials. However, the capability of phase-change materials for phase transformation depends heavily on how they are exposed to thermal energy and how they are allowed to release thermal energy. For example, in order to transform into an amorphous phase, phase-change materials may need to achieve temperatures of approximately seven hundred degrees Celsius (700° C.) or more, and may need to cool down within hundreds of nanoseconds.

In order to rapidly cool down phase-change materials, heat must be dissipated from a PCM RF switch by using heat spreading techniques. However, heat spreaders may pose manufacturing cost and device design challenges. Further, heat spreaders may result in increased RF noise coupling which can propagate across a semiconductor device and increase RF noise experienced by integrated passive devices (IPDs). Techniques for reducing RF noise coupling applicable to conventional semiconductor devices may not be suitable for PCM RF switches. Various modifications in structure can have significant impact on thermal energy management that decrease the reliability of PCM RF switches. Accordingly, integrating PCM RF switches with passive devices in the same semiconductor device can present significant challenges. Specialty manufacturing is often impractical, and large scale manufacturing generally trades practicality for the ability to control device characteristics.

Thus, there is a need in the art for semiconductor devices with improved heat dissipation for PCM RF switches and reduced RF noise coupling when PCM RF switches are integrated with passive devices in the same semiconductor device.

SUMMARY

The present disclosure is directed to substrates and heat spreaders for heat management and RF isolation in integrated semiconductor devices having phase-change material (PCM) radio frequency (RF) switches, substantially as shown in and/or described in connection with at least one of the figures, and as set forth in the claims.

DETAILED DESCRIPTION

Figure 1:
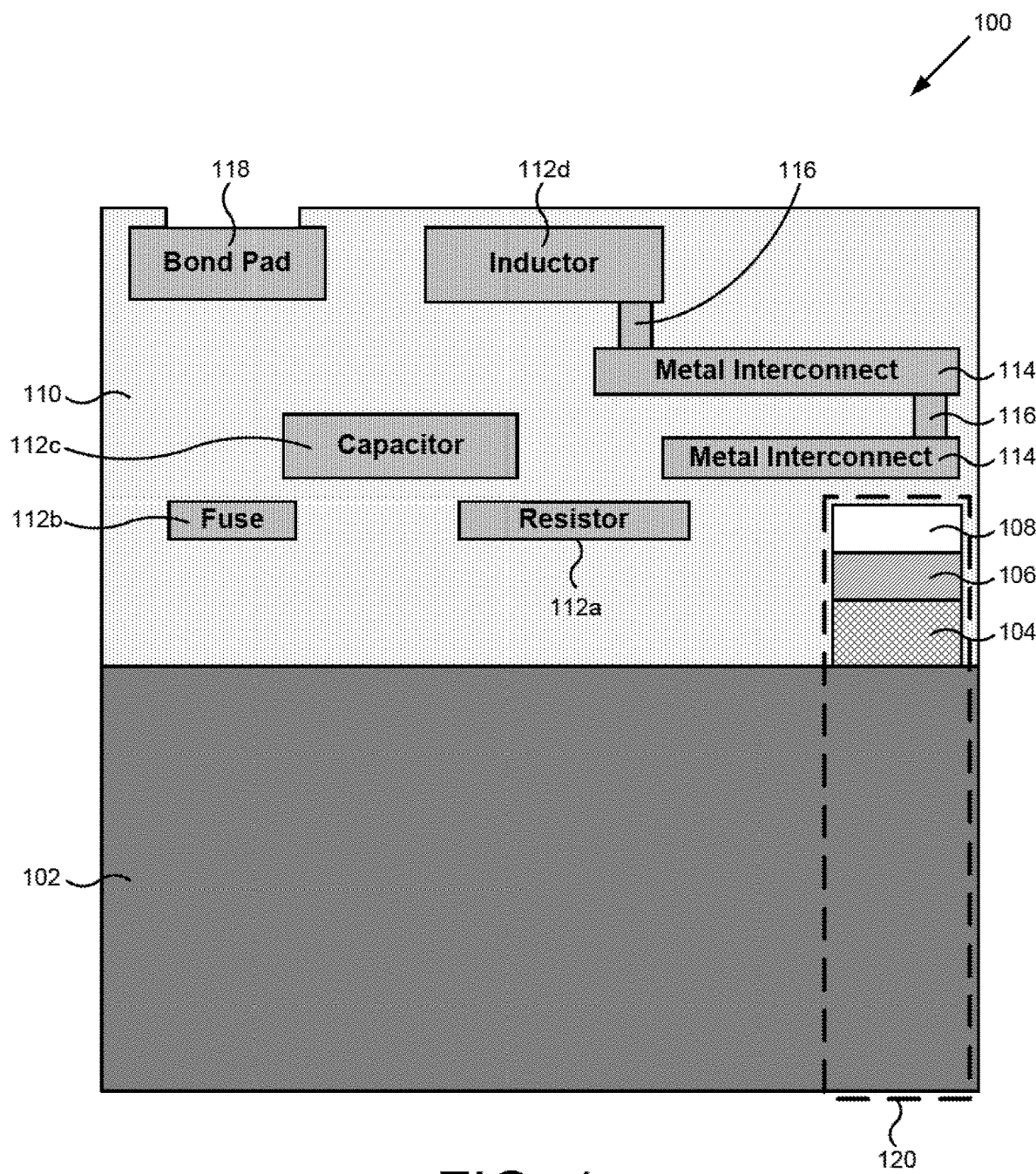
FIG. 1 illustrates a cross-sectional view of a semiconductor device according to one implementation of the present.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 illustrates a cross-sectional view of a semiconductor device according to one implementation of the present application. It is noted that the term "semiconductor device" in the present application broadly refers to a device that might use a semiconductor in one or more layers, or in a substrate, or in parts of the device only. In other words, although a device may include non-semiconductor layers or elements, such as passive devices, metal layers, dielectrics, or generally elements that cannot assume different types and degrees of conductivity as semiconductors do, such a device is still referred to as a "semiconductor device" in the present application due to presence or potential presence of semiconductors in the device. Despite the fact that in general a device referred to as a "semiconductor device" in the present application may include some semiconductor elements, it is possible that use of semiconductors be minimized or entirely avoided in certain implementations according to the present application.

Semiconductor device 100 includes electrically conductive or semiconductive substrate 102, electrically insulating layer 104, electrically insulative heat spreader 106, phase-change material (PCM) radio frequency (RF) switch 108, and dielectric 110. It is noted that dielectric 110 corresponds to multiple dielectric layers and levels corresponding to a multi-level metallization process as known in the art. The various dielectric layers are shown as single dielectric 110 to preserve focus on the inventive concepts disclosed in the present application. FIG. 1 further illustrates various exemplary integrated passive devices (IPDs), such as IPD 112a (shown as resistor 112a by way of example), IPD 112b (shown as fuse 112b by way of example), IPD 12c (shown as capacitor 112c by way of example), and IPD 112d (shown as inductor 112d by way of example), which may be collectively referred to as IPDs 112 in the present application, exemplary metal interconnects 114, exemplary vias 116, and exemplary bond pad 118.

Electrically conductive or semiconductive substrate 102 is situated below dielectric 110 and below electrically insulating layer 104. Electrically insulating layer 104 is situated over electrically conductive or semiconductive substrate 102. Electrically insulative heat spreader 106 is situated over electrically insulating layer 104. PCM RF switch 108 is situated over electrically insulative heat spreader 106. PCM RF switch 108 utilizes PCM to transfer input RF signals in an ON state and to block input RF signals in an OFF state. As described below, PCM RF switch 108 requires effective heat dissipation and is a source of RF noise coupling and/or RF signal interference due to coupling (for example, capacitive coupling) to neighboring elements and components in the semiconductor device. For brevity in the present application, the terms RF noise and RF noise coupling are used to generally denote various kinds of unwanted RF signals such as, but not limited to, RF signal interference from neighboring elements and components or interference from harmonics.

Dielectric 110 is situated over PCM RF switch 108 and over electrically conductive or semiconductive substrate 102. Dielectric 110 aids formation and processing of IPDs 112, metal interconnects 114, vias 116, and bond pad 118 in a multi-level metallization. In various implementations, dielectric 110 can comprise borophosphosilicate glass (BPSG), tetra-ethyl ortho-silicate (TEOS), silicon oxide ($Si_XO_Y$), silicon nitride ($Si_XN_Y$), silicon oxynitride ($Si_XO_YN_Z$), or another dielectric.

IPDs 112 are situated in dielectric 110, adjacent to PCM RF switch 108 or above PCM RF switch 108. As stated above, dielectric 110 can comprise several interlayer metal levels (not shown in FIG. 1) and interlayer dielectrics (not shown in FIG. 1) that provide insulation between the interlayer metal levels. IPDs 112 and metal interconnects 114 can be formed in the interlayer metal levels, and vias 116 can be formed in the interlayer dielectrics, all situated adjacent to or above PCM RF switch 108.

In the present implementation, IPD 112a represents a resistor, IPD 112b represents a fuse, IPD 112c represents a capacitor, such as a metal-oxide-metal (MOM) or a metal-insulator-metal (MIM) capacitor, and IPD 112d represents an inductor. In various implementations, semiconductor device 100 in FIG. 1 can include more or fewer IPDs than those shown in FIG. 1. As described below, the performance of IPDs 112 is affected by RF noise coupling in electrically conductive or semiconductive substrate 102 between PCM RF switch 108 and IPDs 112.

IPD 112d is coupled to metal interconnects 114 by vias 116. Metal interconnects, such as metal interconnects 114 can route electrical signals between IPDs, such as IPD 112d, and various devices (not shown in FIG. 1). Bond pad 118 is exposed at the top of semiconductor device 100 to provide for external connection. Metal interconnects 114, vias 116, and bond pad 118 are shown in semiconductor device 100 of FIG. 1 in order to provide additional context and to better illustrate that various other layers can also exist in a semiconductor device in which a PCM RF switch, such as PCM RF switch 108, may reside. In various implementations, semiconductor device 100 in FIG. 1 can include more or fewer metal interconnects, vias, and/or bond pads than shown in FIG. 1.

Figure 2:
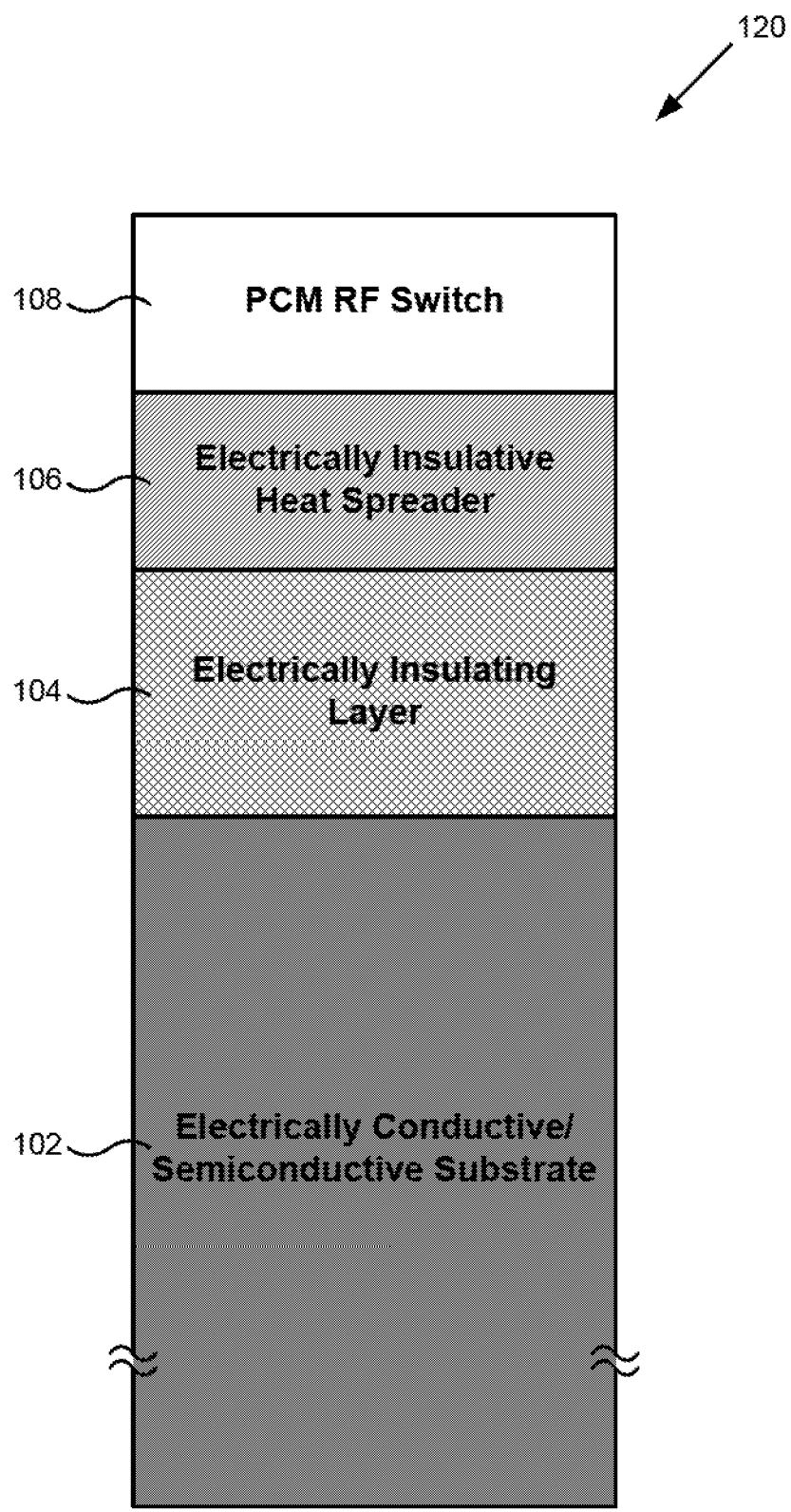
FIG. 2 illustrates a cross-sectional view of a portion of a semiconductor device corresponding to FIG. 1 according to one implementation of the present application.

FIG. 2 illustrates a cross-sectional view of a portion of a semiconductor device corresponding to FIG. 1 according to one implementation of the present application. Semiconductor device portion 120 in FIG. 2 represents the outlined portion 120 in FIG. 1. As shown in FIG. 2, electrically conductive or semiconductive substrate 102 is situated below electrically insulating layer 104. Electrically conductive or semiconductive substrate 102 can comprise any material with low electrical resistivity. In various implementations, electrically conductive or semiconductive substrate 102 is a silicon (Si), germanium (Ge), silicon germanium ($Si_XGe_Y$), silicon carbide ($Si_XC_Y$), or group III-V substrate.

Electrically insulating layer 104 is situated over electrically conductive or semiconductive substrate 102. Electrically insulating layer 104 can comprise any material with high electrical resistivity. In various implementations, electrically insulating layer 104 is silicon oxide ($Si_XO_Y$), silicon nitride ($Si_XN_Y$), silicon oxynitride ($Si_XO_YN_Z$), or another dielectric. In one implementation, the electrical resistivity of electrically insulating layer 104 can be approximately one trillion ohm-meters or greater (>1E12 Ω·m).

Electrically insulative heat spreader 106 is situated over electrically insulating layer 104. Electrically insulative heat spreader 106 can comprise any material with high thermal conductivity and high electrical resistivity. In various implementations, electrically insulative heat spreader 106 can comprise aluminum nitride ($Al_XN_Y$), aluminum oxide ($Al_XO_Y$), beryllium oxide ($Be_XO_Y$), diamond, or diamond-like carbon. In one implementation, the thermal conductivity of electrically insulative heat spreader 106 can range from approximately thirty five watts per meter-kelvin to approximately two hundred fifty watts per meter-kelvin (35 W/(m·K)-250 W/(m·K)). In one implementation, the electrical resistivity of electrically insulative heat spreader 106 can be approximately one trillion ohm-meters or greater (>1$E$12 Ω·m).

PCM RF switch 108 is situated over electrically insulative heat spreader 106. PCM RF switch 108 utilizes PCM to transfer input RF signals in an ON state and to block input RF signals in an OFF state. As described below, PCM RF switch 108 switches between ON and OFF states in response to crystallizing or amorphizing heat pulses generated by a heating element. The PCM must be heated and rapidly quenched in order for PCM RF switch 108 to switch states. In order to rapidly quench the PCM, heat must be dissipated from the heating element and from PCM RF switch 108.

Absent the present implementation and in a different approach, PCM RF switch 108 is situated directly on electrically conductive or semiconductive substrate 102. Electrically conductive or semiconductive substrate 102 may be chosen because it supports common fabrication techniques and has high thermal conductivity. However, because it is electrically conductive or semiconductive, it can parasitically couple to electrically conductive elements of PCM RF switch 108. In turn, RF noise coupling in electrically conductive or semiconductive substrate 102 can propagate across a semiconductor device, such as semiconductor device 100 in FIG. 1, and increase RF noise experienced by IPDs, such as IPDs 112 in FIG. 1. This RF noise coupling in electrically conductive or semiconductive substrate 102 between PCM RF switch 108 and IPDs 112 decreases the performance of IPDs 112.

In the present implementation, electrically insulative heat spreader 106 and electrically insulating layer 104 intervene and provide separation between PCM RF switch 108 and electrically conductive or semiconductive substrate 102. Because electrically insulative heat spreader 106 has high electrical resistivity, it reduces RF noise coupling in electrically conductive or semiconductive substrate 102 from PCM RF switch 108. Because electrically insulating layer 104 also has high electrical resistivity, it further reduces RF noise coupling in electrically conductive or semiconductive substrate 102 from PCM RF switch 108. The separation between PCM RF switch 108 and electrically conductive or semiconductive substrate 102 can be further increased by increasing the thickness of electrically insulative layer 104 to further reduce RF noise coupling. Moreover, because electrically insulative heat spreader 106 has high thermal conductivity, it effectively dissipates heat generated by PCM RF switch 108.

Figure 3:
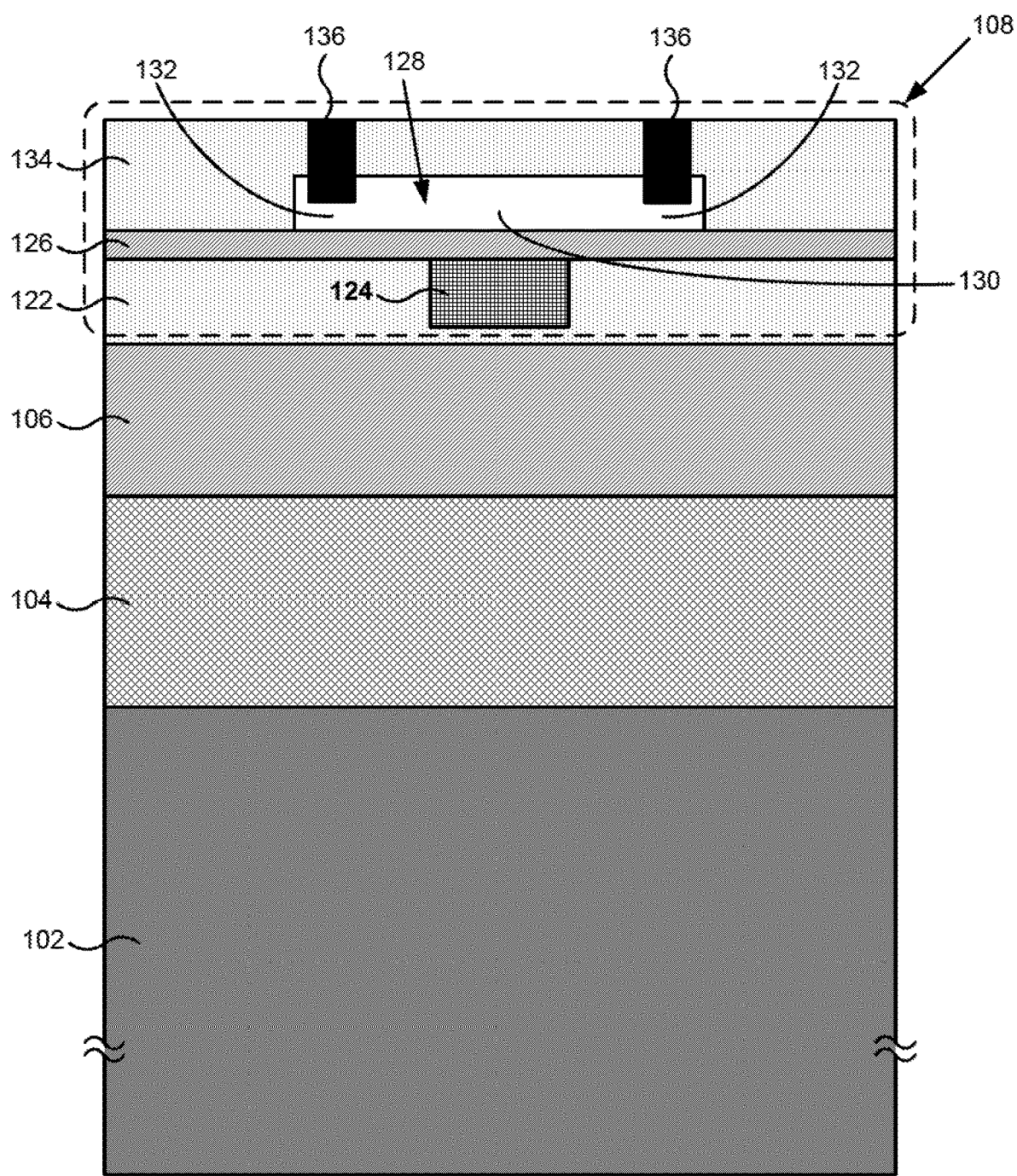
FIG. 3 illustrates a detailed cross-sectional view of a portion of a semiconductor device corresponding to FIG. 1 according to one implementation of the present application.

FIG. 3 illustrates a detailed cross-sectional view of a portion of a semiconductor device corresponding to FIG. 1 according to one implementation of the present application. In particular, FIG. 3 illustrates details of PCM RF switch 108 shown in FIG. 1. As shown in FIG. 3, PCM RF switch 108 is situated over electrically insulative heat spreader 106, which is situated over electrically insulative layer 104, which is situated over electrically conductive or semiconductive substrate 102. PCM RF switch 108 includes thermally resistive material 122, heater line 124, thermally conductive and electrically insulating layer 126, PCM 128 having active segment 130 and passive segments 132, contact dielectric 134, and PCM contacts 136.

Thermally resistive material 122 is situated over electrically insulative heat spreader 106, and is adjacent to the sides of heater line 124. Thermally resistive material 122 extends along the width of PCM RF switch 108, and is also coplanar with the top of heater line 124. In various implementations, thermally resistive material 122 can have a relative width and/or a relative thickness greater or less than shown in FIG. 3. Thermally resistive material 122 can comprise any material with thermal conductivity lower than that of thermally conductive and electrically insulating layer 126. In various implementations, thermally resistive material 122 can comprise $Si_XO_Y$, $Si_XN_Y$, or another dielectric.

In the present implementation, a segment of thermally resistive material 122 is situated between heater line 124 and electrically insulative heat spreader 106. This segment performs as a heat valve. Vertical heat dissipation from heater line 124 is heavily biased toward active segment 130 of PCM 128, rather than toward electrically insulative heat spreader 106. Thus, active segment 130 of PCM 128 can reach higher temperatures for the same applied pulse power. In one implementation, the thickness of thermally resistive material 122 under heater line 124 is approximately two hundred angstroms (200 Å). In one implementation, rather than PCM RF switch 108 including a heat valve as a segment of thermally resistive material 122, PCM RF switch 108 can include a heat valve distinct from thermally resistive material 122. For example, PCM RF switch 108 can include a liner around heater line 124 that performs as a heat valve. As another example, PCM RF switch 108 can include another thermally resistive material under heater line 124 having a width substantially matching a width of heater line 124. In one implementation, a heat valve can be omitted, and heater line 124 can be situated on electrically insulative heat spreader 106.

Heater line 124 is situated in thermally resistive material 122. Heater line 124 also underlies active segment 130 of PCM 128. Heater line 124 generates a crystallizing heat pulse or an amorphizing heat pulse for transforming active segment 130 of PCM 128. Heater line 124 can comprise any material capable of Joule heating. Preferably, heater line 124 comprises a material that exhibits minimal or substantially no electromigration, thermal stress migration, and/or agglomeration. In various implementations, heater line 124 can comprise tungsten (W), molybdenum (Mo), titanium (Ti), titanium nitride (TiN), titanium tungsten (TiW), tantalum (Ta), tantalum nitride (TaN), nickel chromium (NiCr), or nickel chromium silicon (NiCrSi). For example, in one implementation, heater line 124 comprises tungsten lined with titanium and titanium nitride. Heater line 124 may be formed by a damascene process, a subtractive etch process, or any other suitable process. Heater line 124 can be connected to electrodes of a pulse generator (not shown in FIG. 3) that generates crystallizing or amorphizing voltage or current pulses.

Thermally conductive and electrically insulating layer 126 in FIG. 3 is a sheet situated on top of heater line 124 and thermally resistive material 122, and under PCM 128 and, in particular, under active segment 130 of PCM 128. Thermally conductive and electrically insulating layer 126 ensures efficient heat transfer from heater line 124 toward active segment 130 of PCM 128, while electrically insulating heater line 124 from PCM contacts 136, PCM 128, and other neighboring structures.

Thermally conductive and electrically insulating layer 126 can comprise any material with high thermal conductivity and high electrical resistivity. In various implementations, thermally conductive and electrically insulating layer 126 can comprise $Si_XC_Y$, $Al_XN_Y$, $Al_XO_Y$, $Be_XO_Y$, diamond, or diamond-like carbon. In the implementation illustrated in FIG. 3, thermally conductive and electrically insulating layer 126 is shown to comprise the same material as electrically insulative heat spreader 106. However, in other implementations, thermally conductive and electrically insulating layer 126 and electrically insulative heat spreader 106 can comprise different materials. In one implementation, thermally conductive and electrically insulating layer 126 can have a higher thermal conductivity than electrically insulative heat spreader 106 to ensure that a heat pulse generated by heater line 124 dissipates toward active segment 130 of PCM 128 more rapidly than it dissipates toward electrically insulative heat spreader 106. In one implementation, thermally conductive and electrically insulating layer 126 can be a nugget that does not extend along the width of PCM RF switch 108. For example, thermally conductive and electrically insulating layer 126 can be a nugget approximately aligned with heater line 124.

PCM 128 is situated on top of thermally conductive and electrically insulating layer 126. PCM 128 includes active segment 130 and passive segments 132. Active segment 130 of PCM 128 approximately overlies heater line 124 and is approximately defined by heater line 124. Passive segments 132 of PCM 128 extend outward and are transverse to heater line 124, and are situated approximately under PCM contacts 136. As used herein, "active segment" refers to a segment of PCM that transforms between crystalline and amorphous phases, for example, in response to a crystallizing or an amorphizing heat pulse generated by heater line 124, whereas "passive segment" refers to a segment of PCM that does not make such transformation and maintains a crystalline phase (i.e., maintains a conductive state).

With proper heat pulses and heat dissipation, active segment 130 of PCM 128 can transform between crystalline and amorphous phases, allowing PCM RF switch 108 to switch between ON and OFF states respectively. Active segment 130 of PCM 128 must be heated and rapidly quenched in order for PCM RF switch 108 to switch states. If active segment 130 of PCM 128 does not quench rapidly enough, it will not transform and PCM RF switch 108 will fail to switch states. How rapidly active segment 130 of PCM 128 must be quenched depends on the material, volume, and temperature of PCM 128. In one implementation, the quench time window can be approximately one hundred nanoseconds (100 ns) or greater or less.

PCM 128 can be germanium telluride ($Ge_XTe_Y$), germanium antimony telluride ($Ge_XSb_YTe_Z$), germanium selenide ($Ge_XSe_Y$), or any other chalcogenide. In various implementations, PCM 128 can be germanium telluride having from forty percent to sixty percent germanium by composition (i.e., $Ge_XTe_Y$, where $0.4 \leq X \leq 0.6$ and $Y=1-X$). The material for PCM 128 can be chosen based upon ON state resistivity, OFF state electric field breakdown threshold, crystallization temperature, melting temperature, or other considerations. PCM 128 can be formed, for example, by physical vapor deposition (PVD), sputtering, chemical vapor deposition (CVD), evaporation, ion beam deposition (IBD), or atomic layer deposition (ALD). It is noted that in FIG. 3, current flowing in heater line 124 flows substantially under active segment 130 of PCM 128.

Contact dielectric 134 is situated over PCM 128 and over thermally conductive and electrically insulating layer 126. In various implementations, contact dielectric 134 is silicon dioxide ($SiO_2$), boron-doped $SiO_2$, phosphorous-doped $SiO_2$, $Si_XN_Y$, or another dielectric. In various implementations, contact dielectric 134 is a low-k dielectric, such as fluorinated silicon dioxide, carbon-doped silicon oxide, or spin-on organic polymer. Contact dielectric 134 can be provided, for example, by plasma enhanced CVD (PECVD), high density plasma CVD (HDP-CVD), or spin-on processes.

PCM contacts 136 extend through contact dielectric 134 and connect to passive segments 132 of PCM 128. PCM contacts 136 provide RF signals to/from PCM 128. In various implementations, PCM contacts 136 can comprise tungsten (W), aluminum (Al), or copper (Cu).

Because PCM RF switch 108 includes thermally resistive material 122 on the sides of heater line 124, less heat transfers horizontally (i.e., from the sides) and more heat dissipates vertically, from heater line 124 both toward active segment 130 of PCM 128 and toward electrically insulative heat spreader 106. Because electrically insulative heat spreader 106 has high thermal conductivity, it effectively dissipates this heat generated by heater line 124. Thus, active segment 130 of PCM 128 can rapidly quench and successfully transform phases, and PCM RF switch 108 can switch states with improved reliability. Additionally, PCM 128 can utilize different materials and different dimensions that require faster quench times.

Because electrically insulative heat spreader 106 has high electrical resistivity, it reduces RF noise coupling in electrically conductive or semiconductive substrate 102 from PCM contacts 136, PCM 128, and other neighboring structures in PCM RF switch 108. Accordingly, less RF noise propagates across semiconductor device 100 (shown in FIG. 1) to IPDs 112 (shown in FIG. 1), improving the performance of IPDs 112 and allowing semiconductor device 100 to be more densely integrated. Because electrically insulating layer 104 also has high electrical resistivity, it further reduces RF noise coupling in electrically conductive or semiconductive substrate 102 from PCM RF switch 108.

Figure 4:
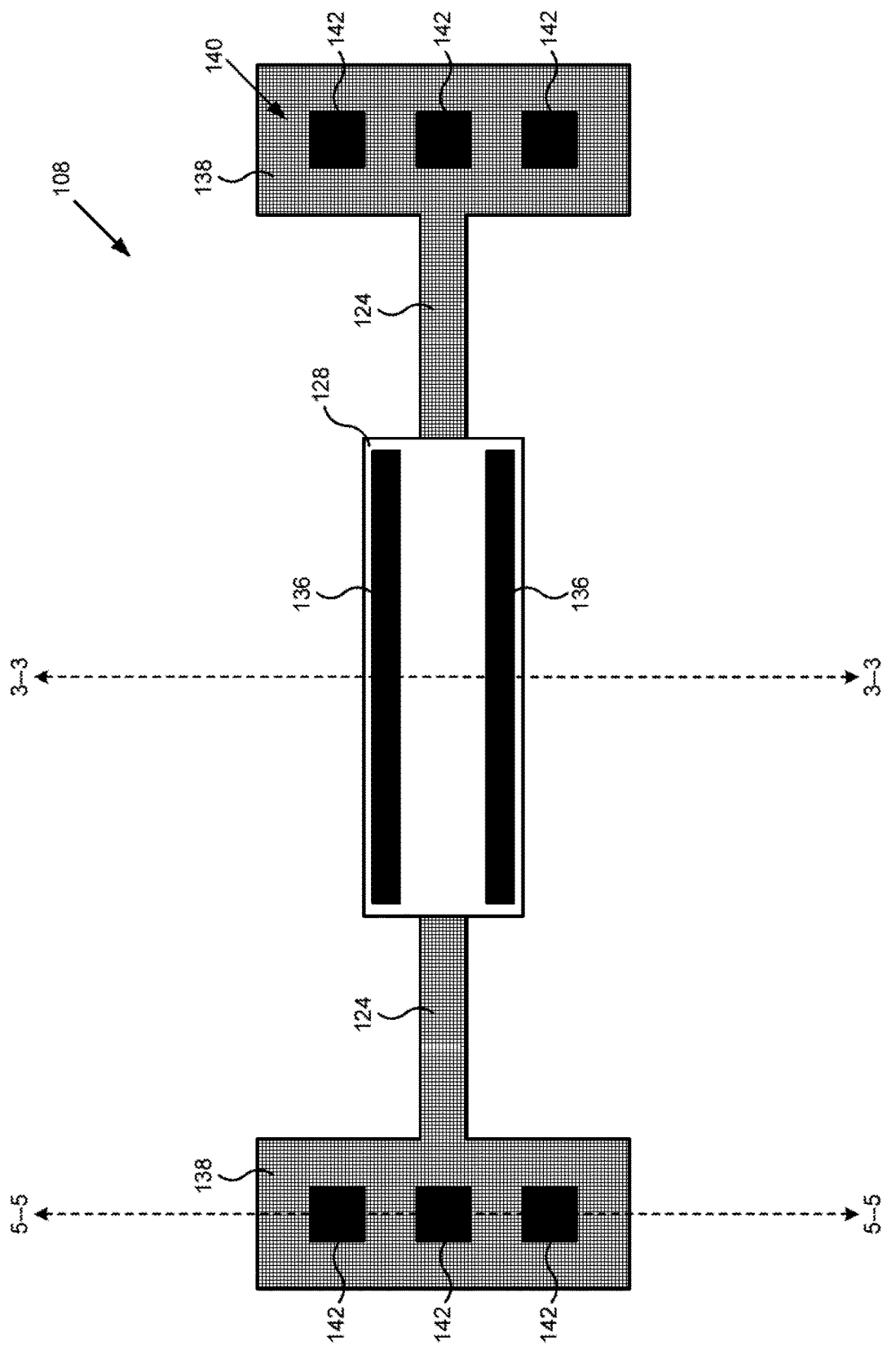
FIG. 4 illustrates a top view of a portion of a semiconductor device corresponding to FIG. 1 according to one implementation of the present application.

FIG. 4 illustrates a top view of a portion of a semiconductor device corresponding to FIG. 1 according to one implementation of the present application. In particular, FIG. 4 illustrates details of a top view of PCM RF switch 108 shown in FIG. 1. FIG. 3 represents a cross-sectional view along line "3-3" in FIG. 4. As shown in FIG. 4, PCM RF switch 108 includes heating element 140 having heater line 124, terminal segments 138, and heater contacts 142. Also shown in FIG. 4 are top views of PCM 128, and PCM contacts 136. For purposes of illustration, the top view in FIG. 4 shows selected structures of a semiconductor device. The semiconductor device may include other structures not shown in FIG. 4, such as electrically insulative heat spreader 106 (shown in FIG. 3) underlying PCM RF switch 108, and thermally conductive and electrically insulating layer 126 (shown in FIG. 3) underlying PCM 128.

Heating element 140 extends along PCM RF switch 108 transverse to PCM 128 and, as stated above, includes heater line 124 and terminal segments 138. Heater line 124 is approximately centered in heating element 140. Heater line 124 underlies PCM 128. Terminal segments 138 are situated at the two ends of heating element 140. In the present implementation, terminal segments 138 of heating element 140 are integrally formed with heater line 124 using any materials and processes described above with respect to heater line 124.

In the present implementation, terminal segments 138 occupy a relatively large area so that heating element 140 can generate a crystallizing heat pulse or an amorphizing heat pulse for transforming an active segment of PCM 128, as described above. For example, electrodes of a voltage or current source (not shown in FIG. 4) large enough to handle a crystallizing current pulse or an amorphizing current pulse without significant losses can connect to terminal segments 138 of heating element 140 by heater contacts 142. In other implementations, terminal segments 138 may have any other size or shape. In the present implementation, three heater contacts 142 are connected to each of terminal segments 138 of heating element 140. In various implementations, more or fewer heater contacts 142 can be used. In various implementations, heater contacts 142 can have shapes or arrangements other than those shown in FIG. 4. In various implementations, heater contacts 142 can comprise tungsten (W), aluminum (Al), or copper (Cu).

PCM 128 overlies heater line 124 of heating element 140. In response to a crystallizing or an amorphizing heat pulse generated by heating element 140, an active segment of PCM 128 can transform from a crystalline phase that easily conducts electrical current to an amorphous phase that does not easily conduct electrical current and, thus, can transform the state of PCM RF switch 108 to an ON state or an OFF state. As described above, electrically insulative heat spreader 106 (shown in FIG. 3) is situated under PCM RF switch 108 and dissipates heat generated by heating element 140. As a result, PCM 128 can rapidly quench and successfully transform phases, and PCM RF switch 108 can switch states with improved reliability.

PCM contacts 136 connect to passive segments of PCM 128. PCM contacts 136 provide RF signals to and from PCM 128. In various implementations, PCM contacts 136 can comprise tungsten (W), aluminum (Al), or copper (Cu).

Figure 5:
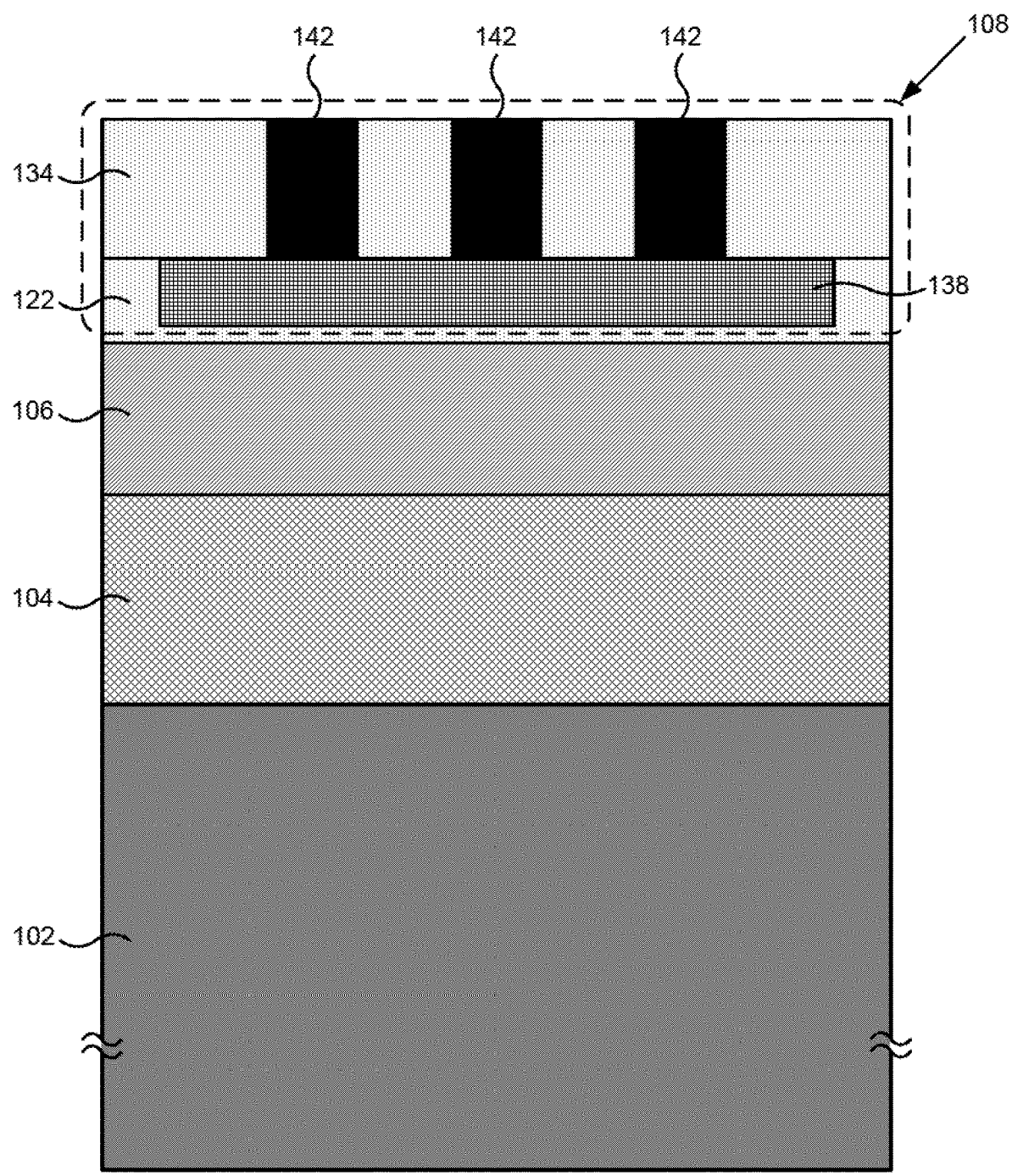
FIG. 5 illustrates a detailed cross-sectional view of a portion of a semiconductor device corresponding to FIG. 1 according to one implementation of the present application.

FIG. 5 illustrates a detailed cross-sectional view of a portion of a semiconductor device corresponding to FIG. 1 according to one implementation of the present application. FIG. 5 represents a cross-sectional view along line "5-5" in FIG. 4. As shown in FIG. 5, PCM RF switch 108 is situated over electrically insulative heat spreader 106, which is situated over electrically insulating layer 104, which is situated over electrically conductive or semiconductive substrate 102. PCM RF switch 108 includes thermally resistive material 122, terminal segment 138, contact dielectric 134, and heater contacts 142. Electrically insulative heat spreader 106, electrically insulating layer 104, electrically conductive or semiconductive substrate 102, thermally resistive material 122, terminal segment 138, contact dielectric 134, and heater contacts 142 in FIG. 5 may have any implementations and advantages described above.

The cross-sectional view in FIG. 5 is similar to the cross-sectional view in FIG. 3, except for differences noted below. The cross-sectional view in FIG. 5 does not include PCM 128 or thermally conductive and electrically insulating layer 126, because line "5-5" in FIG. 4 lies along terminal segment 138 of heating element 140, which extends outward and is transverse to PCM 128. Instead of PCM 128 and thermally conductive and electrically insulating layer 126, contact dielectric 134 is situated over terminal segment 138 and thermally resistive material 122. Terminal segment 138 in FIG. 5 extends farther along PCM RF switch 108 than heater line 124 in FIG. 3, because terminal segment 138 occupies a relatively large area. Heater contacts 142 extend through contact dielectric 134 and connect to terminal segment 138.

Figure 6:
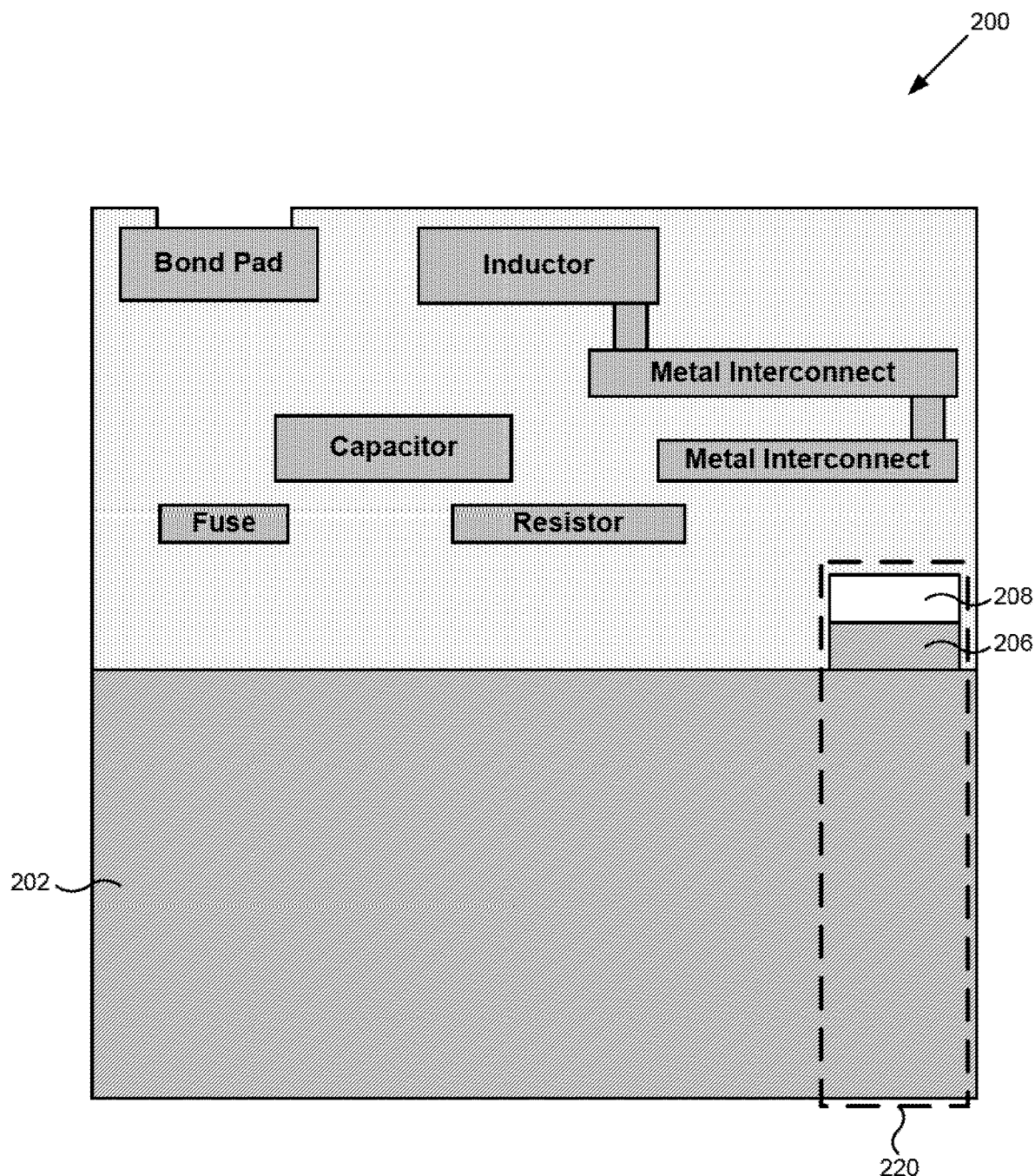
FIG. 6 illustrates a cross-sectional view of a semiconductor device according to one implementation of the present application.

FIG. 6 illustrates a cross-sectional view of a semiconductor device according to one implementation of the present application. Semiconductor device 200 in FIG. 6 is similar to semiconductor device 100 in FIG. 1, except that semiconductor device 200 in FIG. 6 utilizes electrically insulative and thermally conductive substrate 202 under electrically insulative heat spreader 206. Electrically insulative heat spreader 206 is situated over electrically insulative and thermally conductive substrate 202. PCM RF switch 208 is situated over electrically insulative heat spreader 206. Notably, semiconductor device 200 does not include an electrically insulating layer, such as electrically insulating layer 104 in FIG. 1, over a substrate. As described below, semiconductor device 200 in FIG. 6 improves heat dissipation from PCM RF switch 208 and reduces RF noise from PCM RF switch 208.

Figure 7:
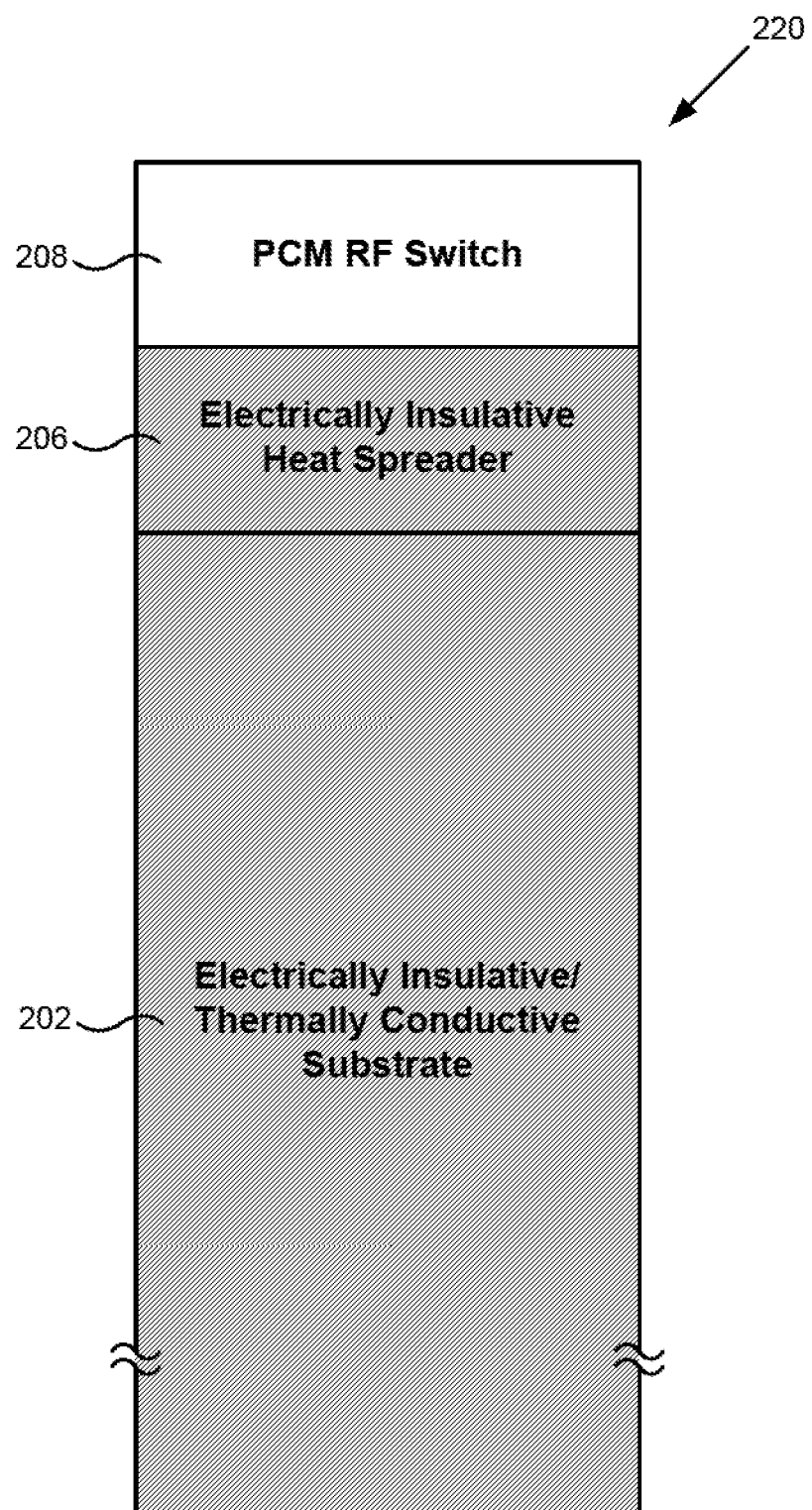
FIG. 7 illustrates a cross-sectional view of a portion of a semiconductor device corresponding to FIG. 6 according to one implementation of the present application.

FIG. 7 illustrates a cross-sectional view of a portion of a semiconductor device corresponding to FIG. 6 according to one implementation of the present application. Semiconductor device portion 220 in FIG. 7 represents the outlined portion 220 in FIG. 6. As shown in FIG. 7, electrically insulative and thermally conductive substrate 202 is situated below electrically insulative heat spreader 206. Electrically insulative and thermally conductive substrate 202 can comprise any material with high thermal conductivity and high electrical resistivity. In various implementations, electrically insulative and thermally conductive substrate 202 can comprise $Al_xN_y$, $Al_xO_y$, $Be_xO_y$, diamond, or diamond-like carbon. In one implementation, the thermal conductivity of electrically insulative and thermally conductive substrate 202 can range from approximately thirty five watts per meter-kelvin to approximately two hundred fifty watts per meter-kelvin (35 W/(m·K)-250 W/(m·K)). In one implementation, the electrical resistivity of electrically insulative and thermally conductive substrate 202 can be approximately one trillion ohm-meters or greater (>1E12 Ω·m).

Electrically insulative heat spreader 206 is situated over electrically insulative and thermally conductive substrate 202. Electrically insulative heat spreader 206 in FIG. 7 can comprise any materials described above with respect to electrically insulative heat spreader 106 in FIG. 2. In the implementation illustrated in FIG. 7, electrically insulative and thermally conductive substrate 202 comprises the same material as electrically insulative heat spreader 206. However, in other implementations, electrically insulative and thermally conductive substrate 202 and electrically insulative heat spreader 206 can comprise different materials. In one implementation, electrically insulative heat spreader 206 can have a higher thermal conductivity than electrically insulative and thermally conductive substrate 202.

In the present implementation, because electrically insulative heat spreader 206 has high electrical resistivity, it reduces RF noise coupling from PCM RF switch 208. Because electrically insulative and thermally conductive substrate 202 also has high electrical resistivity, it further reduces RF noise coupling from PCM RF switch 208. Accordingly, an insulating layer, such as electrically insulating layer 104 in FIG. 2, is not needed. PCM RF switch 208 can be situated closer to electrically insulative and thermally conductive substrate 202.

Because electrically insulative heat spreader 206 has high thermal conductivity, it effectively dissipates heat generated by PCM RF switch 208. Because electrically insulative and thermally conductive substrate 202 also has high thermal conductivity, it further dissipates heat generated by PCM RF switch 208. Electrically insulative and thermally conductive substrate 202 also has large mass (shown in FIG. 6), which dissipates heat more efficiently. Because electrically insulative and thermally conductive substrate 202 is situated on the bottom of the semiconductor device in FIG. 7, when the semiconductor device is mounted on a printed circuit board (PCB) (not shown in FIG. 7), electrically insulative and thermally conductive substrate 202 can further dissipate heat utilizing the PCB. Accordingly, the semiconductor device in FIG. 7 will dissipate heat more effectively than the semiconductor device in FIG. 2 that uses electrically insulative heat spreader 106 alone.

Figure 8:
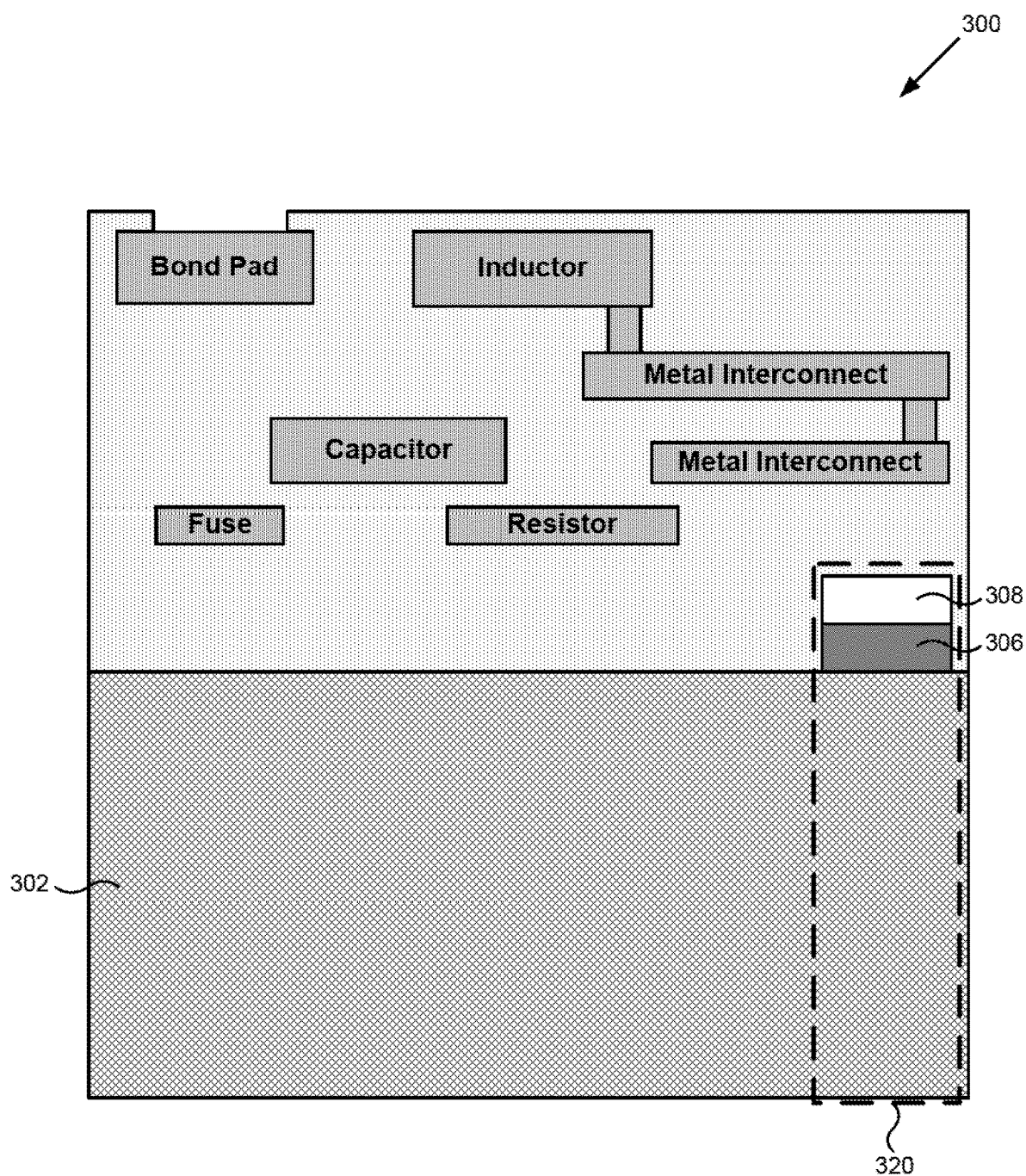
FIG. 8 illustrates a cross-sectional view of a semiconductor device according to one implementation of the present application.

FIG. 8 illustrates a cross-sectional view of a semiconductor device according to one implementation of the present.

Semiconductor device 300 in FIG. 8 is similar to semiconductor device 200 in FIG. 6, except that semiconductor device 300 in FIG. 8 utilizes electrically insulative substrate 302 under electrically conductive or semiconductive heat spreader 306. Electrically conductive or semiconductive heat spreader 306 is situated over electrically insulative substrate 302. PCM RF switch 308 is situated over electrically conductive or semiconductive heat spreader 306. Notably, semiconductor device 300 does not include an electrically insulating layer, such as electrically insulating layer 104 in FIG. 1, over a substrate. As described below, semiconductor device 300 in FIG. 8 improves heat dissipation from PCM RF switch 308 and reduces RF noise from PCM RF switch 308.

Figure 9:
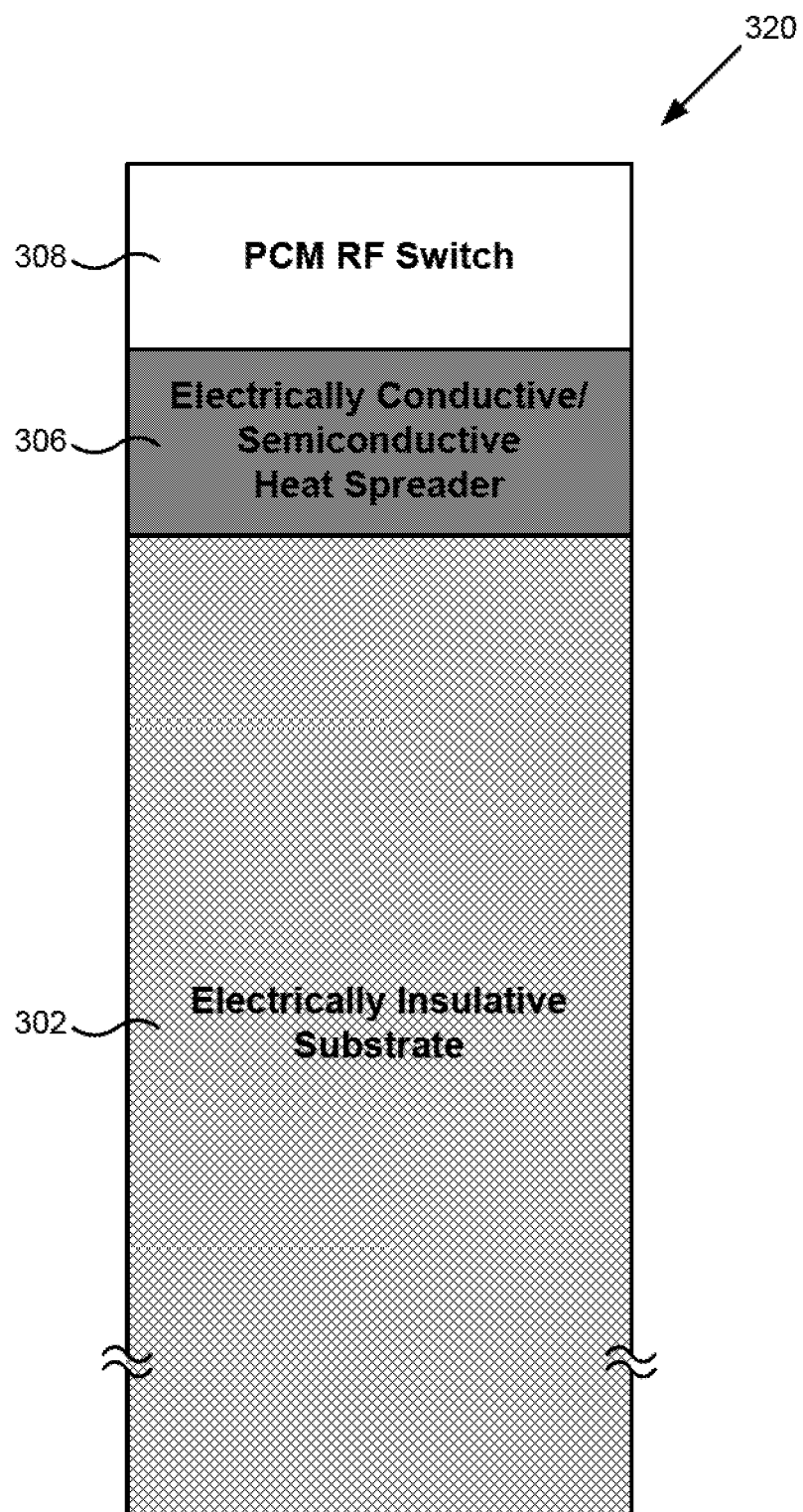
FIG. 9 illustrates a cross-sectional view of a portion of a semiconductor device corresponding to FIG. 8 according to one implementation of the present application.

FIG. 9 illustrates a cross-sectional view of a portion of a semiconductor device corresponding to FIG. 8 according to one implementation of the present application. Semiconductor device portion 320 in FIG. 9 represents the outlined portion 320 in FIG. 8. As shown in FIG. 9, electrically insulative substrate 302 is situated below electrically conductive or semiconductive heat spreader 306. Electrically insulative substrate 302 can comprise any material with high electrical resistivity. Electrically insulative substrate 302 may or may not be thermally conductive. In one implementation, electrically insulative substrate 302 comprises glass and is not thermally conductive. In other implementations, electrically insulative substrate 302 can comprise $Al_XN_Y$, $Al_XO_Y$, $Be_XO_Y$, diamond, or diamond-like carbon, and is thermally conductive. In one implementation, the electrical resistivity of electrically insulative substrate 302 can be approximately one trillion ohm-meters or greater (>1E12 Ω·m).

Electrically conductive or semiconductive heat spreader 306 is situated over electrically insulative substrate 302. Electrically conductive or semiconductive heat spreader 306 can comprise any material with low electrical resistivity. In various implementations, electrically conductive or semiconductive heat spreader 306 can comprise Si, Ge, $Si_XGe_Y$, or $Si_XC_Y$. In one implementation, the thermal conductivity of electrically conductive or semiconductive heat spreader 306 can range from approximately one hundred fifty watts per meter-kelvin to approximately three hundred seventy watts per meter-kelvin (150 W/(m·K)-370 W/(m·K)).

In the present implementation, because electrically conductive or semiconductive heat spreader 306 has low electrical resistivity, it may couple RF noise from PCM RF switch 308. However, because electrically insulative substrate 302 has high electrical resistivity, it reduces the RF noise coupling from PCM RF switch 308. Accordingly, less RF noise propagates across semiconductor device 300 (shown in FIG. 8) to IPDs.

Because electrically conductive or semiconductive heat spreader 306 has high thermal conductivity, it effectively dissipates heat generated by PCM RF switch 308. Additionally, electrically conductive or semiconductive heat spreader 306 in FIG. 9 is generally better at transferring heat. In particular, heat generally transfers faster in monocrystalline materials than in amorphous materials. For example, electrically insulative heat spreader 206 in FIG. 7 can be amorphous $Al_XN_Y$, and its thermal conductivity can range from approximately thirty five watts per meter-kelvin to approximately fifty watts per meter-kelvin (35 W/(m·K)-120 W/(m·K)). In contrast, for example, electrically conductive or semiconductive heat spreader 306 in FIG. 9 can be monocrystalline Si, and its thermal conductivity can be approximately one hundred seventy watts per meter-kelvin (170 W/(m·K)). Where electrically insulative substrate 302 also has high thermal conductivity, it further dissipates heat generated by PCM RF switch 308.

Figure 10:
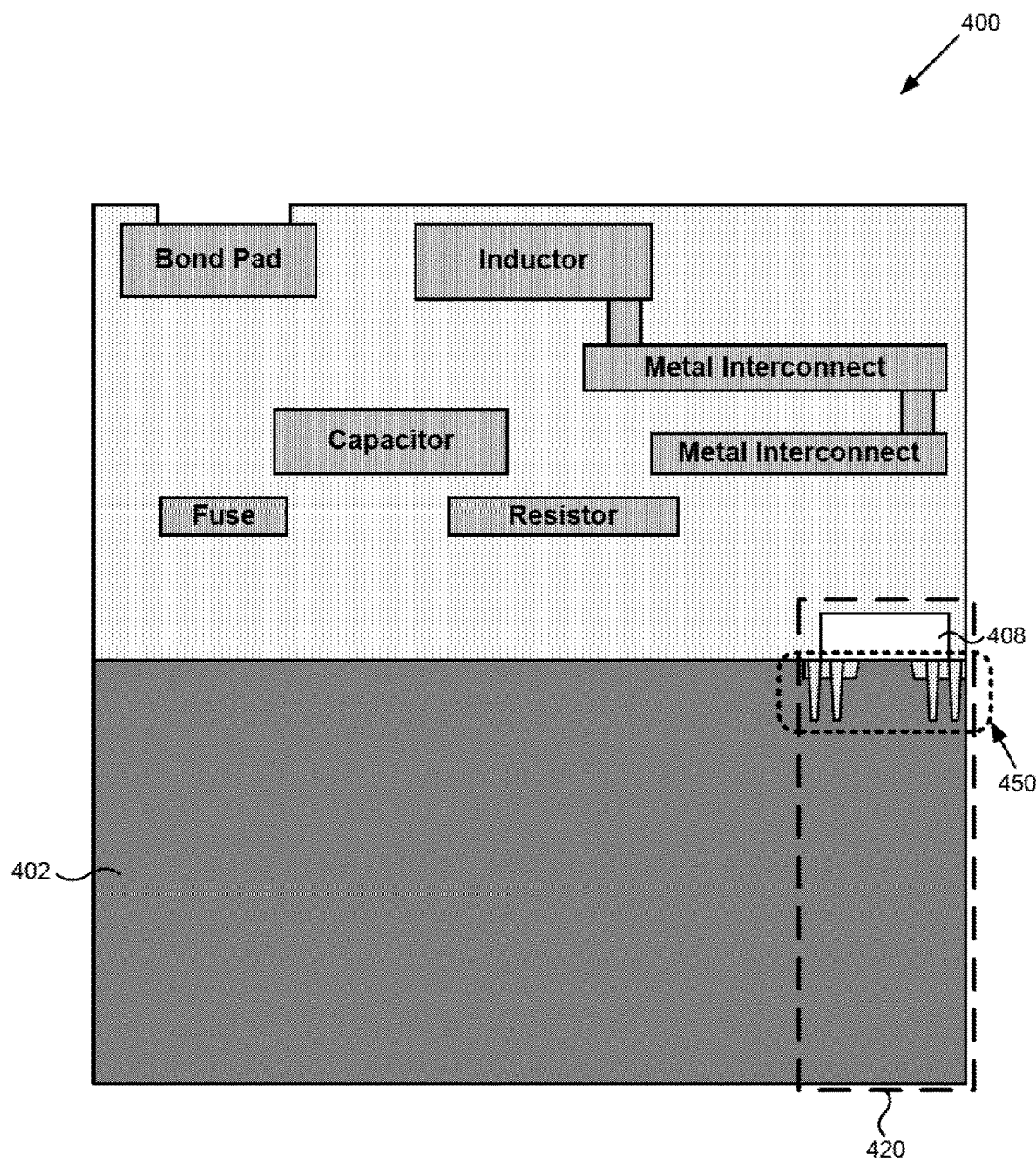
FIG. 10 illustrates a cross-sectional view of a semiconductor device according to one implementation of the present application.

FIG. 10 illustrates a cross-sectional view of a semiconductor device according to one implementation of the present application. Semiconductor device 400 in FIG. 10 is similar to semiconductor device 300 in FIG. 8, except that semiconductor device 400 in FIG. 10 utilizes RF isolation region 450 in electrically conductive or semiconductive substrate 402, and PCM RF switch 408 is situated over RF isolation region 450 in electrically conductive or semiconductive substrate 402. Notably, semiconductor device 400 does not include a heat spreader, such as electrically conductive or semiconductive heat spreader 306 in FIG. 8. As described below, semiconductor device 400 in FIG. 10 improves heat dissipation from PCM RF switch 408 and reduces RF noise from PCM RF switch 408.

Figure 11:
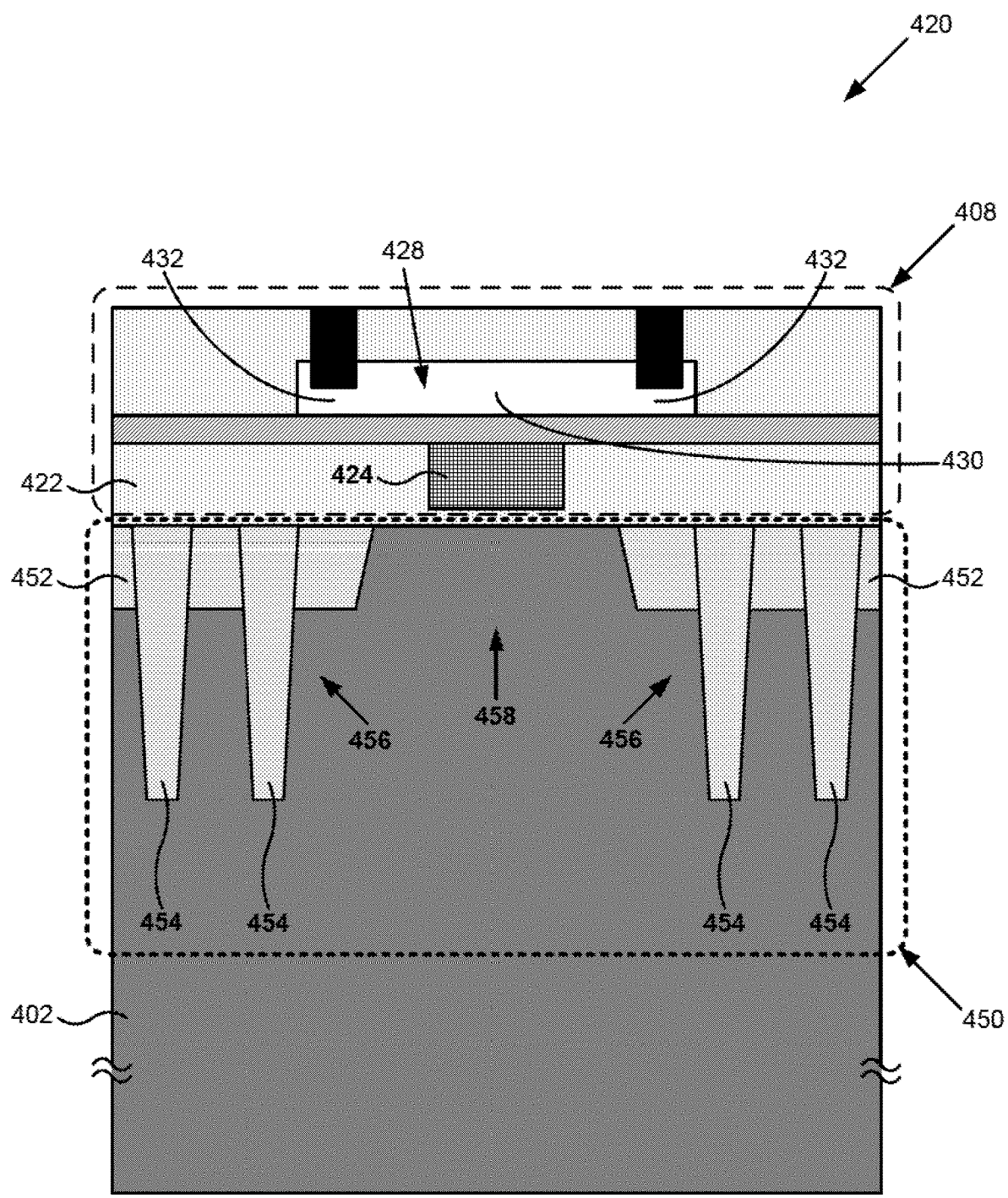
FIG. 11 illustrates a detailed cross-sectional view of a portion of a semiconductor corresponding to FIG. 10 according to one implementation of the present application.

FIG. 11 illustrates a detailed cross-sectional view of a portion of a semiconductor corresponding to FIG. 10 according to one implementation of the present application. Semiconductor device portion 420 in FIG. 11 represents the outlined portion 420 in FIG. 10. FIG. 11 illustrates details of RF isolation region 450 and PCM RF switch 408 shown in FIG. 10.

As shown in FIG. 11, PCM RF switch 408 is situated over RF isolation region 450 of electrically conductive or semiconductive substrate 402. Electrically conductive or semiconductive substrate 402 can comprise any material with low electrical resistivity. In various implementations, electrically conductive or semiconductive substrate 402 is a Si, Ge, $Si_XGe_Y$, $Si_XC_Y$, or group III-V substrate.

RF isolation region 450 includes shallow trench insulations (STIs) 452, deep trenches 454, insulated portions 456 of electrically conductive or semiconductive substrate 402, and exposed portion 458 of electrically conductive or semiconductive substrate 402. It is noted that the STI regions may instead be implemented as LOCOS (local oxidation of silicon) insulation, poly-buffered LOCOS insulation, or any other technique or structure for substrate isolation where the semiconductor device is patterned into regions of dielectric (for example, silicon oxide) and semiconductor (for example, silicon). However, in the present implementation, the relative planarity of the STI technique and structure can be beneficial.

STIs 452 extend into electrically conductive or semiconductive substrate 402 from its top surface. STIs 452 primarily reduce RF noise from coupling directly between PCM RF switch 408 and electrically conductive or semiconductive substrate 402. STIs 452 can comprise, for example, silicon dioxide ($SiO_2$). In one implementation, the depth of STIs 452 can be approximately half a micron (0.5 μm). Deep trenches 454 extend through STIs 452, and into electrically conductive or semiconductive substrate 402. Deep trenches 454 primarily reduce RF noise from propagating across electrically conductive or semiconductive substrate 402. Deep trenches 454 can likewise comprise, for example, $SiO_2$. In one implementation, the depth of STIs 452 can be approximately seven microns (7 μm). In the implementation illustrated in FIG. 11, RF isolation region 450 is shown to include both STIs 452 and deep trenches 454. However, in other implementations, RF isolation region 450 can include only STIs 452, or only deep trenches 454. In various implementations, RF isolation region 450 can utilize locally oxidized silicon (LOCOS) instead of or in addition to STIs 452 and deep trenches 454.

Insulated portions 456 are any portions of electrically conductive or semiconductive substrate 402 insulated by STIs 452 and deep trenches 454. Insulated portions 456 are situated approximately under passive segments 432 of PCM 428 and extend outward away from heater line 424. Insulated portions 456 provide electrical isolation between PCM RF switch 408 and electrically conductive or semiconductive substrate 402 so as to reduce RF noise coupling in electrically conductive or semiconductive substrate 402 between PCM RF switch 408 and IPDs (shown in FIG. 10).

Exposed portion 458 is a portion of electrically conductive or semiconductive substrate 402 that is not insulated at its top surface. STIs 452 and deep trenches 454 approximately surround exposed portion 458 of electrically conductive or semiconductive substrate 402. Exposed portion 458 is situated under heater line 424 and active segment 430 of PCM 428. Exposed portion 458 allows electrically conductive or semiconductive substrate 402 to dissipate heat generated by heater line 424. In various implementations, exposed portion 458 may be wider or narrower than shown in FIG. 11.

Notably, the semiconductor device in FIG. 11 does not include a dedicated heat spreader, such as electrically insulative heat spreader 106 in FIG. 3, because RF isolation region 450, and particularly exposed portion 458, allows electrically conductive or semiconductive substrate 402 to dissipate heat generated by heater line 424. In this implementation, thermally resistive material 422 under heater line 424 performing as a heat valve also prevents heater line 424 from shorting to electrically conductive or semiconductive substrate 402.

Figure 12:
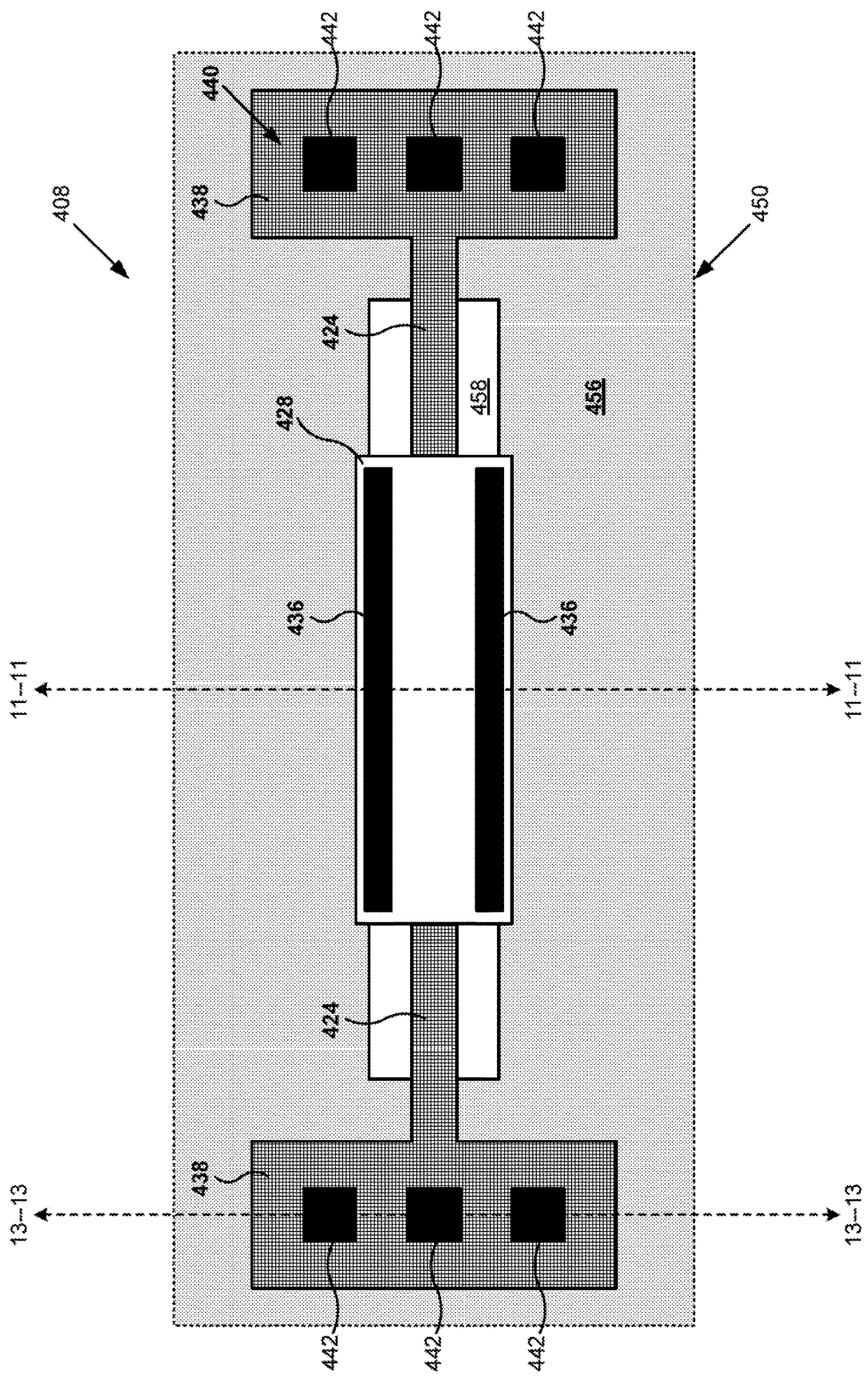
FIG. 12 illustrates a top view of a portion of a semiconductor device corresponding to FIG. 10 according to one implementation of the present application.

FIG. 12 illustrates a top view of a portion of a semiconductor device corresponding to FIG. 10 according to one implementation of the present application. In particular, FIG. 12 illustrates details of PCM RF switch 408 shown in FIG. 10. FIG. 11 represents a cross-sectional view along line "11-11" in FIG. 12. For purposes of illustration, the top view in FIG. 12 shows selected structures of a semiconductor device. The semiconductor device may include other structures not shown in FIG. 12, such as a thermally conductive and electrically insulating layer underlying PCM 428.

As shown in FIG. 12, PCM RF switch 408 is situated over RF isolation region 450. In RF isolation region 450, exposed portion 458 is situated under heater line 424 of heating element 440. As described above, exposed portion 458 dissipates heat generated by heater line 424 of heating element 440. In various implementations, exposed portion 458 may have any sizes or shapes other than those shown in FIG. 12.

In RF isolation region 450, insulated portion 456 surrounds exposed portion 458. As described above, insulated portion 456 provides electrical isolation from PCM RF switch 408. Notably, in FIG. 12, insulated portion 456 is situated under terminal segments 438 of heating element 440 and under heater contacts 442. Because heater contacts 442 themselves can be a source of RF noise, for example, due to parasitic coupling with PCM contacts 436, insulated portion 456 situated under heater contacts 442 can further reduce RF noise coupling from PCM RF switch 408.

Figure 13:
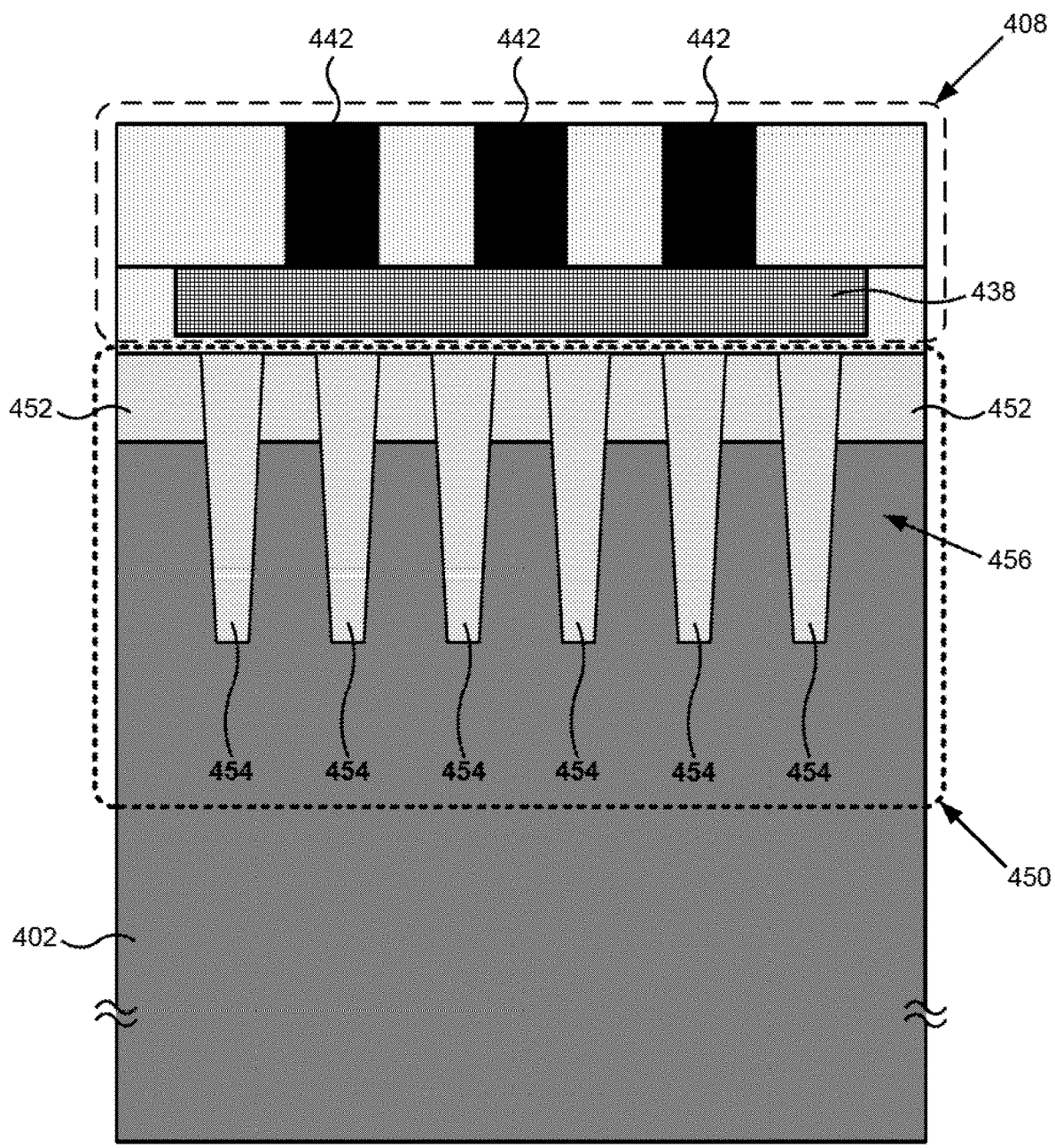
FIG. 13 illustrates a detailed cross-sectional view of a portion of a semiconductor device corresponding to FIG. 10 according to one implementation of the present application.

FIG. 13 illustrates a detailed cross-sectional view of a portion of a semiconductor device corresponding to FIG. 10 according to one implementation of the present application. FIG. 13 represents a cross-sectional view along line "13-13" in FIG. 12. As shown in FIG. 13, PCM RF switch 408 is situated over RF isolation region 450 of electrically conductive or semiconductive substrate 402.

The cross-sectional view in FIG. 13 is similar to the cross-sectional view in FIG. 5, except for differences noted below. The cross-sectional view in FIG. 13 includes RF isolation region 450 situated under PCM RF switch 408. As shown in FIG. 13, in RF isolation region 450, STI 452 and deep trenches 454 extend along the length of the semiconductor device. Thus, insulated portion 456 is situated under terminal segment 438 and under heater contacts 442.

Semiconductor devices according to the present application provide means for effectively dissipating heat generated by a heating element of a PCM RF switch, while also reducing RF noise coupling in a substrate between the PCM RF switch and IPDs. Ensuring effective heat dissipation improves quench times of PCM, and increases the reliability of the PCM RF switch. Reducing RF noise coupling improves the performance of IPDs, and allows for more densely integrated semiconductor devices.

Thus, various implementations of the present application achieve semiconductor devices with improved heat dissipation for PCM RF switches and reduced RF noise coupling for integrated devices that overcome the deficiencies in the art. From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A semiconductor device including an electrically insulative substrate, said semiconductor device further comprising:
   at least one integrated passive device (IPD);
   a phase-change material (PCM) radio frequency (RF) switch comprising:
      a heating element;
      a PCM situated over said heating element;
      PCM contacts situated over passive segments of said PCM;
      said heating element extending transverse to said PCM, a heater line of said heating element approximately underlying an active segment of said PCM;
   said at least one IPD situated adjacent to or above said PCM RF switch in said semiconductor device;
   said PCM RF switch being situated over an electrically conductive or semiconductive heat spreader, said electrically conductive or semiconductive heat spreader dissipating heat generated by said heating element, wherein said electrically conductive or semiconductive heat spreader is situated over said electrically insulative substrate;
   said electrically insulative substrate reducing RF noise coupling between said PCM RF switch and said at least one IPD.

2. The semiconductor device of claim 1, wherein said at least one IPD is selected from the group consisting of a resistor, a capacitor, an inductor, and a fuse.

3. The semiconductor device of claim 1, wherein said electrically conductive or semiconductive heat spreader comprises material selected from the group consisting of silicon (Si) and silicon carbide ($Si_XC_Y$).

4. The semiconductor device of claim 1, wherein said electrically insulative substrate comprises material selected from the group consisting of glass, aluminum nitride ($Al_XN_Y$), aluminum oxide ($Al_XO_Y$), beryllium oxide ($Be_XO_Y$), diamond, and diamond-like carbon.

5. The semiconductor device of claim 1, wherein said PCM comprises material selected from the group consisting of germanium telluride ($Ge_XTe_Y$), germanium antimony telluride ($Ge_XSb_YTe_Z$), germanium selenide ($Ge_XSe_Y$), and any other chalcogenide.

6. The semiconductor device of claim 1, wherein said heater line comprises material selected from the group consisting of tungsten (W), molybdenum (Mo), titanium (Ti), titanium nitride (TiN), titanium tungsten (TiW), tantalum (Ta), tantalum nitride (TaN), nickel chromium (NiCr), and nickel chromium silicon (NiCrSi).

7. A semiconductor device including an electrically insulative substrate, said semiconductor device further comprising:
   at least one integrated passive device (IPD);
   a phase-change material (PCM) radio frequency (RF) switch comprising:
      a heating element;
      a PCM situated over said heating element;
      a heater line of said heating element approximately underlying said PCM;
   said at least one IPD situated adjacent to or above said PCM RF switch in said semiconductor device;
   said PCM RF switch being situated over an electrically conductive or semiconductive heat spreader, said electrically conductive or semiconductive heat spreader dissipating heat generated by said heating element, wherein said electrically conductive or semiconductive heat spreader is situated over said electrically insulative substrate;
   said electrically insulative substrate reducing RF noise coupling between said PCM RF switch and said at least one IPD.

8. The semiconductor device of claim 7, wherein said at least one IPD is selected from the group consisting of a resistor, a capacitor, an inductor, and a fuse.

9. The semiconductor device of claim 7, wherein said electrically conductive or semiconductive heat spreader comprises material selected from the group consisting of silicon (Si) and silicon carbide ($Si_XC_Y$).

10. The semiconductor device of claim 7, wherein said electrically insulative substrate comprises material selected from the group consisting of glass, aluminum nitride ($Al_XN_Y$), aluminum oxide ($Al_XO_Y$), beryllium oxide ($Be_XO_Y$), diamond, and diamond-like carbon.

11. The semiconductor device of claim 7, wherein said PCM comprises material selected from the group consisting of germanium telluride ($Ge_XTe_Y$), germanium antimony telluride ($Ge_XSb_YTe_Z$), germanium selenide ($Ge_XSe_Y$), and any other chalcogenide.

12. The semiconductor device of claim 7, wherein said heater line comprises material selected from the group consisting of tungsten (W), molybdenum (Mo), titanium (Ti), titanium nitride (TiN), titanium tungsten (TiW), tantalum (Ta), tantalum nitride (TaN), nickel chromium (NiCr), and nickel chromium silicon (NiCrSi).

13. A semiconductor device including an electrically insulative substrate, said semiconductor device further comprising:
   at least one integrated passive device (IPD);
   a phase-change material (PCM) radio frequency (RF) switch comprising:
      a heating element;
      a PCM situated over said heating element;
      a heater line of said heating element approximately underlying said PCM;
   said PCM RF switch being situated over an electrically conductive or semiconductive heat spreader;
   said electrically conductive or semiconductive heat spreader is situated over said electrically insulative substrate.

14. The semiconductor device of claim 13, wherein said at least one IPD is selected from the group consisting of a resistor, a capacitor, an inductor, and a fuse.

15. The semiconductor device of claim 13, wherein said electrically conductive or semiconductive heat spreader comprises material selected from the group consisting of silicon (Si) and silicon carbide ($Si_XC_Y$).

16. The semiconductor device of claim 13, wherein said electrically insulative substrate comprises material selected from the group consisting of glass, aluminum nitride ($Al_XN_Y$), aluminum oxide ($Al_XO_Y$), beryllium oxide ($Be_XO_Y$), diamond, and diamond-like carbon.

17. The semiconductor device of claim 13, wherein said PCM comprises material selected from the group consisting of germanium telluride ($Ge_XTe_Y$), germanium antimony telluride ($Ge_XSb_YTe_Z$), germanium selenide ($Ge_XSe_Y$), and any other chalcogenide.

18. The semiconductor device of claim 13, wherein said heater line comprises material selected from the group consisting of tungsten (W), molybdenum (Mo), titanium (Ti), titanium nitride (TiN), titanium tungsten (TiW), tantalum (Ta), tantalum nitride (TaN), nickel chromium (NiCr), and nickel chromium silicon (NiCrSi).

* * * * *